US012749539B2

(12) United States Patent
Kim et al.

(10) Patent No.: US 12,749,539 B2
(45) Date of Patent: Sep. 29, 2026

(54) MEMORY DEVICE AND METHOD OF OPERATING THE MEMORY DEVICE

(71) Applicant: SK hynix Inc., Icheon-si (KR)

(72) Inventors: Jong Woo Kim, Icheon-si (KR); Young Cheol Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 108 days.

(21) Appl. No.: 18/804,668

(22) Filed: Aug. 14, 2024

(65) Prior Publication Data

US 2025/0316315 A1 Oct. 9, 2025

(30) Foreign Application Priority Data

Apr. 4, 2024 (KR) ........................ 10-2024-0045864

(51) Int. Cl.

*G11C 16/24* (2006.01)
*G11C 16/04* (2006.01)
*G11C 16/08* (2006.01)
*G11C 16/10* (2006.01)
*G11C 16/34* (2006.01)

(52) U.S. Cl.

CPC .......... *G11C 16/24* (2013.01); *G11C 16/0483* (2013.01); *G11C 16/08* (2013.01); *G11C 16/10* (2013.01); *G11C 16/3459* (2013.01)

(58) Field of Classification Search

CPC ..... G11C 16/24; G11C 16/0483; G11C 16/08; G11C 16/10; G11C 16/3459; G11C 16/32; G11C 2211/5621; G11C 2211/5642; G11C 11/5628; G11C 16/26; G11C 16/34

See application file for complete search history.

(56) References Cited

U.S. PATENT DOCUMENTS 11,699,487 B2 * 7/2023 Lee .................... G11C 16/0483 365/185.23
2014/0169096 A1 * 6/2014 Koo ...................... G11C 16/10 365/185.24
2022/0189557 A1 * 6/2022 Kim .................. G11C 16/3459
2022/0270696 A1 * 8/2022 Choi ...................... G11C 16/24
2023/0062706 A1 * 3/2023 Mun ...................... G11C 16/08

FOREIGN PATENT DOCUMENTS

KR 1020210153475 A 12/2021
KR 1020230057763 A 5/2023

* cited by examiner

*Primary Examiner* — Zhuo H Li

(74) *Attorney, Agent, or Firm* — WILLIAM PARK AND ASSOCIATES LTD.

(57) ABSTRACT

Provided herein is a memory device related to precharging a bit line and a method of operating the memory device. The memory device including a plurality of memory cells each connected to any one of a plurality of word lines, the any one of the plurality of word lines being a selected word line, and programmed to any one of a plurality of program states, a row decoder configured to apply a program voltage or a verify voltage to the selected word line, and a plurality of page buffers connected to the plurality of memory cells through a plurality of bit lines and configured to store precharge data used to determine a precharge voltage of a target bit line connected to a verify target memory cell among the plurality of bit lines while the program voltage is applied to the selected word line.

18 Claims, 9 Drawing Sheets

FIG. 6

| LATCH \ PERIOD | ① | ② | ③ | ④ | ⑤ | ⑥ | ⑦ |
|---|---|---|---|---|---|---|---|
| FIRST LATCH (210) | MAIN VERIFY DATA | PVn-1 CSC DATA | PVn PRECHARGE DATA | PVn SENSING DATA | PVn SENSING DATA + PVn-1 PRECHARGE DATA | PVn-1 SENSING DATA | PVn-1 SENSING DATA |
| SECOND LATCH (220) | PRE-VERIFY DATA | PRE-VERIFY DATA | PRE-VERIFY DATA | PRE-VERIFY DATA | PRE-VERIFY DATA | PRE-VERIFY DATA | PRE-VERIFY DATA |
| THIRD LATCH (230) | LSB DATA + MAIN VERIFY DATA | LSB DATA + MAIN VERIFY DATA | LSB DATA + MAIN VERIFY DATA | LSB DATA + MAIN VERIFY DATA | LSB DATA + MAIN VERIFY DATA | LSB DATA + MAIN VERIFY DATA | LSB DATA + UPDATED MAIN VERIFY DATA |
| FOURTH LATCH (240) | CSB DATA + MAIN VERIFY DATA | CSB DATA + MAIN VERIFY DATA | CSB DATA + MAIN VERIFY DATA | CSB DATA + MAIN VERIFY DATA | CSB DATA + MAIN VERIFY DATA | CSB DATA + MAIN VERIFY DATA | CSB DATA+ UPDATED MAIN VERIFY DATA |
| FIFTH LATCH (250) | MSB DATA + MAIN VERIFY DATA | MSB DATA + MAIN VERIFY DATA | MSB DATA + MAIN VERIFY DATA | MSB DATA + MAIN VERIFY DATA | MSB DATA + MAIN VERIFY DATA | MSB DATA + MAIN VERIFY DATA | MSB DATA + UPDATED MAIN VERIFY DATA |

FIG. 7

| FIRST LATCH (210) \ MEMORY CELL STATE | E | ... | PVn-1 | | PVn | | ... |
|---|---|---|---|---|---|---|---|
| | | | VERIFY-FAILED MEMORY CELL | VERIFY-PASSED MEMORY CELL | VERIFY-FAILED MEMORY CELL | VERIFY-PASSED MEMORY CELL | |
| ① MAIN VERIFY DATA | 1 | ... | 0 | 1 | 0 | 1 | ... |
| ② PVn-1 CSC DATA | 0 | ... | 1 | 0 | 0 | 0 | ... |
| ③ PVn PRECHARGE DATA | 0 | ... | 0 | 0 | 1 | 0 | ... |
| ④ PVn SENSING DATA | 0 | ... | 0 | 0 | 0 | 1 | ... |
| ⑤ PVn SENSING DATA + PVn-1 PRECHARGE DATA | 0 | ... | 1 | 0 | 0 | 1 | ... |
| ⑥ PVn-1 SENSING DATA | 0 | ... | 0 | 1 | 0 | 1 | ... |
| ⑦ PVn-1 SENSING DATA | 0 | ... | 0 | 1 | 0 | 1 | ... |

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2024-0045864 filed on Apr. 4, 2024, in the Korean Intellectual Property Office, the entire contents of which application is incorporated herein by reference.

BACKGROUND

1. Technical Field

Various embodiments of the present disclosure generally relate to a semiconductor device, and more particularly to a memory device related to precharging a bit line during a verify operation and a method of operating the memory device.

2. Related Art

As a device for storing data, a memory device may be divided into a volatile memory device and a nonvolatile memory device.

The memory device may perform a program operation of storing data in memory cells. The program operation may include a program voltage application operation of applying a program voltage to the memory cells and a verify operation of verifying a program state of the memory cells. During the verify operation for a specific program state, the memory device may precharge a bit line connected to a memory cell programmed to a corresponding program state. Namely, the memory device may precharge a target bit line connected to a verify target memory cell, and keep bit lines connected to the remaining memory cells at a ground voltage.

Meanwhile, in order to precharge the target bit line, a preceding operation may be performed for setting precharge data representing whether to precharge a page buffer connected to the target bit line. In this case, a measure capable of reducing the required time for precharging the target bit line is necessary.

SUMMARY

An embodiment of the present disclosure may provide for a memory device. The memory device may include a plurality of memory cells each connected to any one of a plurality of word lines, the any one of the plurality of word lines being a selected word line, and programmed to any one of a plurality of program states, a row decoder configured to apply a program voltage or a verify voltage to the selected word line, and a plurality of page buffers connected to the plurality of memory cells through a plurality of bit lines and configured to store precharge data used to determine a precharge voltage of a target bit line connected to a verify target memory cell among the plurality of bit lines while the program voltage is applied to the selected word line.

An embodiment of the present disclosure may provide for a method of operating a memory device, the memory device including a plurality of memory cells connected to any one of a plurality of word lines, the any one of the plurality of word lines being a selected word line, and a plurality of page buffers connected to the plurality of memory cells through a plurality of bit lines. The method may include applying a program voltage to the selected word line, setting precharge data for precharging a first bit line connected to a memory cell corresponding to a first program state among the plurality of bit lines in a first page buffer connected to the first bit line among the plurality of page buffers while the program voltage is applied to the selected word line, applying a verify voltage for verifying the first program state to the selected word line, and precharging the first bit line through the first page buffer based on the precharge data.

An embodiment of the present disclosure may provide for a memory device. The memory device may include a plurality of memory cells each connected to any one of a plurality of word lines, the any one of the plurality of word lines being a selected word line, and programmed to any one of a plurality of program states, a plurality of page buffers connected to the plurality of memory cells through a plurality of bit lines and configured to store data sensed from the plurality of memory cells, and control logic configured to control a first page buffer connected to a first bit line among a plurality of bit lines among the plurality of page buffers to set first precharge data used to determine a precharge voltage of the first bit line while a program voltage is applied to the selected word line.

BRIEF DESCRIPTION OF THE DRAWINGS

FIG. 6 is a diagram illustrating data stored in a plurality of latches during a program operation according to an embodiment of the present disclosure.

FIG. 7 is a diagram illustrating data stored in a first latch during a program operation according to an embodiment of the present disclosure.

DETAILED DESCRIPTION

Specific structural or functional descriptions in embodiments according to the concept of the present disclosure, introduced in the present specification or application, are only for description of the embodiments of the present disclosure. The embodiments according to the concept of the present disclosure may be implemented in various forms, and should not be construed as being limited to the embodiments described in the specification or application.

Various embodiments of the present disclosure are directed to a memory device capable of improving the performance of a program operation by reducing the time required for a bit line precharge operation, and a method of operating the memory device.

Figure 1:
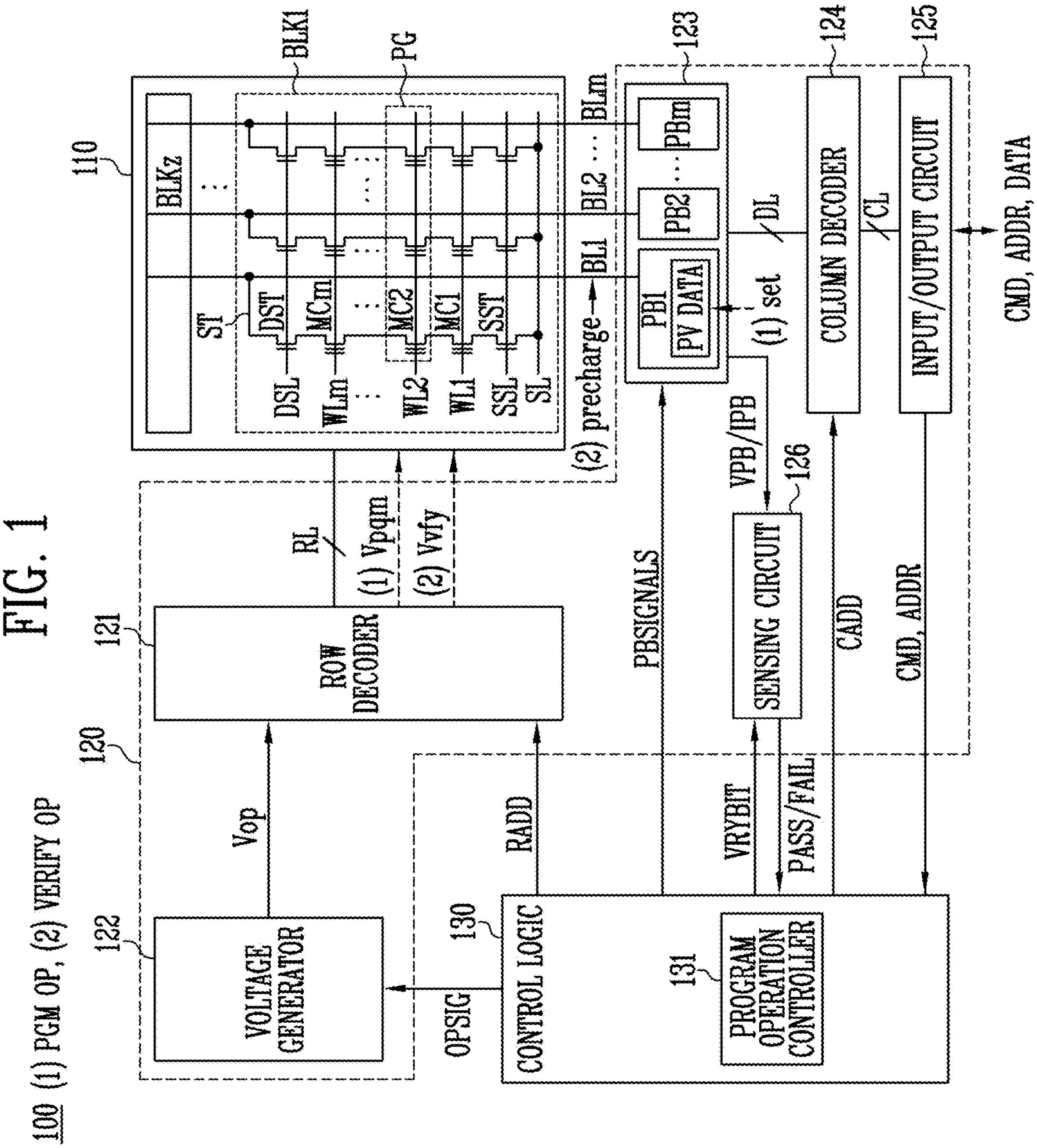
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz.

The plurality of memory blocks BLK1 to BLKz are connected to a row decoder 121 through row lines RL. Here, the row lines RL may include at least one source selection line SSL, a plurality of word lines WL1 to WLm, and at least one drain selection line DSL.

Each of the plurality of memory blocks BLK1 to BLKz may include a plurality of memory cells MC1 to MCm. The plurality of memory cells MC1 to MCm may be connected to a page buffer group 123 through a plurality of bit lines BL1 to BLm. The plurality of memory blocks BLK1 to BLKz may include a plurality of memory cell strings ST connected between the bit lines BL1 to BLm and a source line SL. The memory cell string ST may include at least one source selection transistor SST connected in series between the source line SL and the bit lines BL1 to BLm, the plurality of memory cells MC1 to MCm, and at least one drain selection transistor DST.

Each of the plurality of memory cells MC1 to MCm may be connected to any one of the plurality of word lines WL1 to WLm. Memory cells connected to the same word line may be defined as one page PG. Each of the memory cells MC1 to MCm may store a plurality of data bits.

The peripheral circuit 120 may perform a program operation, a read operation, or an erase operation in a selected area of the memory cell array 110 in response to a control of the control logic 130.

The peripheral circuit 120 may include the row decoder 121, a voltage generator 122, the page buffer group 123, a column decoder 124, an input/output circuit 125, and a sensing circuit 126.

The row decoder 121 may decode a row address RADD received from the control logic 130. The row decoder 121 may select at least one memory block from among the memory blocks BLK1 to BLKz according to the decoded address. In addition, the row decoder 121 may select at least one word line of the memory block selected according to the decoded address. The row decoder 121 may apply voltages Vop generated by the voltage generator 122 to the selected word line.

The voltage generator 122 may use an external power supply voltage supplied to the memory device 100 to generate a plurality of voltages. Specifically, the voltage generator 122 may generate the various operation voltages Vop used for the program, read, and erase operations in response to an operation signal OPSIG. The plurality of generated voltages Vop may be supplied to the memory cell array 110 by the row decoder 121.

The page buffer group 123 includes a plurality of page buffers PB1 to PBm. The plurality of page buffers PB1 to PBm may store data received through the plurality of bit lines BL1 to BLm in response to page buffer control signals PBSIGNALS, or sense voltages or currents of the plurality of bit lines BL1 to BLm during the read or verify operation.

The column decoder 124 may transfer data between the input/output circuit 125 and the page buffer group 123 according to a column address CADD.

The input/output circuit 125 may transfer a command CMD or address ADDR received from a memory controller (not shown) to the control logic 130 or may transmit/receive data DATA to/from the column decoder 124.

The sensing circuit 126 may determine whether a verify operation for a specific program state has passed in response to an application of a verify voltage.

In an embodiment, the sensing circuit 126 may perform a check operation of determining pass or fail of the verify operation based on data sensed from the plurality of memory cells MC1 to MCm while a program voltage is applied to any one word line.

In an example, the sensing circuit 126 may generate a reference current in response to an enable bit signal VRYBIT during the verify operation, and compare a reference voltage generated from the reference current with a sensing voltage VPB received from the page buffer group 123 to output a pass signal PASS or a fail signal FAIL. In an example, the sensing circuit 126 may generate a reference voltage in response to the enable bit signal VRYBIT during the verify operation, and compare a reference current generated from the reference voltage with a sensing current IPB received from the page buffer group 123 to output a pass signal PASS or a fail signal FAIL.

The control logic 130 may output the operation signal OPSIG, the row address RADD, the page buffer control signals PBSIGNALS in response to the command CMD and the address ADDR, and control the peripheral circuits 120.

In an embodiment, the control logic 130 may include a program operation controller 131. In an embodiment, the program operation controller 131 may be implemented in hardware, software, or a combination thereof. For example, the program operation controller 131 may be realized as a program operation controller circuit operating in accordance with an algorithm and/or a processor executing program operation controller code.

The program operation controller 131 may control the program operation of the memory device 100. For example, the program operation controller 131 may provide the voltage generator 122 with the operation signal OPSIG for controlling generation of a program voltage Vpgm, a verify voltage Vvfy or the like, and may decode the address ADDR of a word line of a memory cell with the data DATA stored therein to generate the row address RADD.

In an embodiment, the program operation controller 131 may control the plurality of page buffers PB1 to PBm to store precharge data PV DATA used to determine a precharge voltage of the target bit line connected to the verify target memory cell among the plurality of bit lines BL1 to BLm. For example, the plurality of page buffers PB1 to PBm may set the precharge data PV DATA while the program voltage Vpgm is applied to any one word line in response to the page buffer control signals PBSIGNALS.

For example, the program operation may include a program voltage application operation PGM OP for applying the program voltage to a selected word line, and a verify operation VERIFY OP for verifying the program state of the memory cell. In FIG. 1, operations according to the program voltage application operation PGM OP are illustrated with (1) solid lines, and operations according to the verify operation VERIFY OP may be illustrated with (2) a solid line and a dotted line. In addition, a bit line connected to the first page buffer PB1 may be the target bit line. Specifically, during the program voltage application operation PGM OP, the row decoder 121 may apply the program voltage Vpgm to any one word line. The first page buffer PB1 may set the precharge data PV DATA while the program voltage is applied to any one word line. Then, during the verify operation VERIFY OP, the row decoder 121 may apply the verify voltage Vvfy to the one word line. In addition, the first page buffer PB1 may precharge the first bit line BL1 based on the precharge data PV DATA while the verify voltage Vvfy is applied to the one word line.

Figure 2:
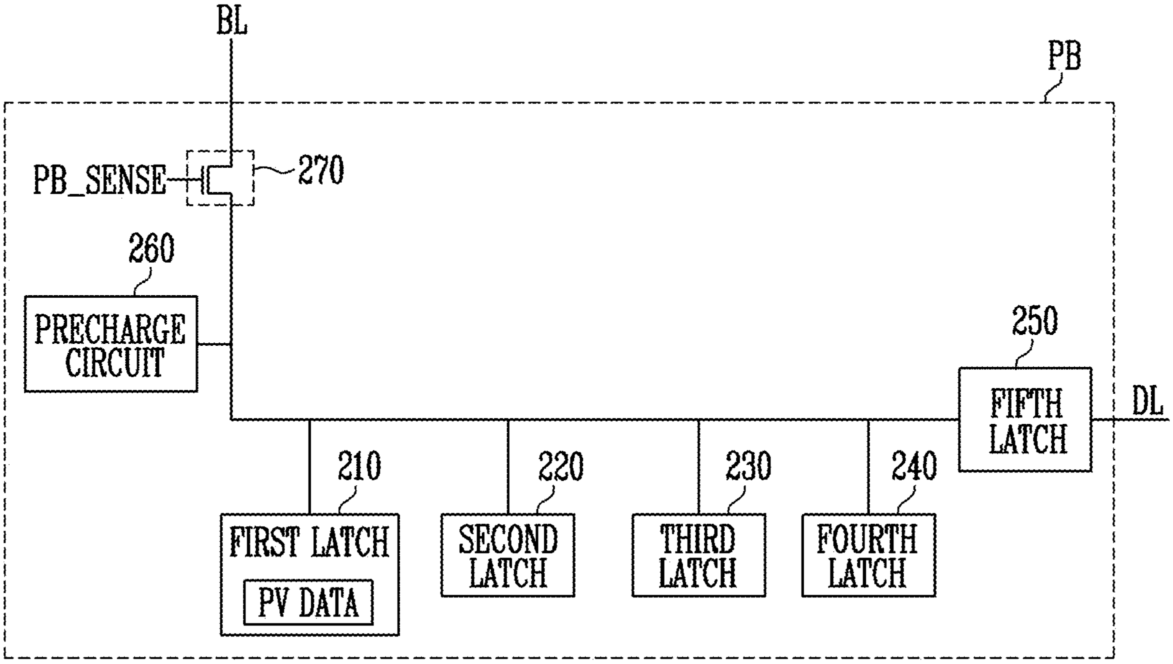
FIG. 2 is a diagram illustrating a page buffer according to an embodiment of the present disclosure.

FIG. 2 is a diagram illustrating a page buffer according to an embodiment of the present disclosure.

Referring to FIGS. 1 and 2, the page buffer PB may represent any one of the plurality of page buffers PB1 to PBm shown in FIG. 1.

The page buffer PB may include a first latch 210, a second latch 220, a third latch 230, a fourth latch 240, a fifth latch 250, a precharge circuit 260, and a bit line connection transistor 270.

The page buffer PB may be connected to the memory cell array 110 through the bit line BL. The page buffer PB may transmit and receive data to and from the column decoder 124 through data lines DL.

The first latch 210 may store the precharge data PV DATA used to determine a voltage to be precharged to the bit line BL or data sensed from the bit line BL. In addition, the first latch 210 may store main verification information about a main verify voltage after the verify operation for the specific program state has passed.

The second latch 220 may store pre-verify data for the pre-verify voltage until the verify operation for the specific program state has passed.

The third latch to fifth latch 230 to 250 may store data to be programmed in the memory cells connected to the bit lines BL. In addition, the third to fifth latches 230 to 250 may distribute and store the main verification information about the main verify voltage until the verify operation for the specific program state passes. For example, until the verify operation for an n-th program state passes, the third latch 230 may store least significant bit (LSB) data and the main verify data, the fourth latch 240 may store central significant bit (CSB) data and the main verify data, and the fifth latch 250 may store most significant bit (MSB) data and the main verify data.

The fifth latch 250 may be connected to the data line DL to receive data from the outside. In an embodiment, the fifth latch 250 may be connected to the data line DL to receive data from outside the fifth latch 250, the page buffer PB, the peripheral circuit 120, or the memory device 100.

The data sensed from the bit line BL in the first latch 210 may be transferred to the sensing circuit 126. Here, the sensed data may be a sensed voltage VPB or a sensed current IPB. The sensing circuit 126 may generate the reference current in response to the enable bit signal VRYBIT and compare the sensed voltage VPB received from the page buffer PB with the reference voltage generated from the reference current to output the verify data. The verification information may include main verify data for the main verify voltage and pre-verify data for the pre-verify voltage. Furthermore, the verify data may be represented as a pass signal PASS or a fail signal FAIL by comparing a threshold voltage of a memory cell with the main verify voltage or the pre-verify voltage.

In addition, the program operation controller 131 may determine, based on the verify data, whether to precharge the bit line BL. The program operation controller 131 may determine, based on the data sensed in the first latch 210, whether to precharge the bit line BL. For example, when the bit line BL is determined to be precharged, the program operation controller 131 may control the first latch 210 to store the precharge data DATA representing a voltage to be precharged to the bit line BL. Unlike this, when the bit line BL is not determined to be precharged, the program operation controller 131 may control the first latch 210 to store the precharge data DATA to instruct the ground voltage to be applied to the bit line BL.

The precharge circuit 260 may precharge the bit line BL to one of a program-enable voltage or a program-inhibit voltage in response to a control of the program operation controller 131. Alternatively, the precharge circuit 260 may perform precharge to a double program voltage.

The bit line connection transistor 270 may be controlled by a bit line connection signal PB_SENSE. For example, when data is read from the memory cell, the bit line connection signal PB_SENSE may change to a high level, and the bit line connection transistor 270 may be turned on to electrically connect the bit line BL and the first latch 210. In addition, when the data stored in the first latch 210 is transferred to the fifth latch 250, the bit line connection signal PB_SENSE may change to a low level and the bit line connection transistor 270 may be turned off to electrically isolate the bit line BL from the first latch 210.

Figure 3:
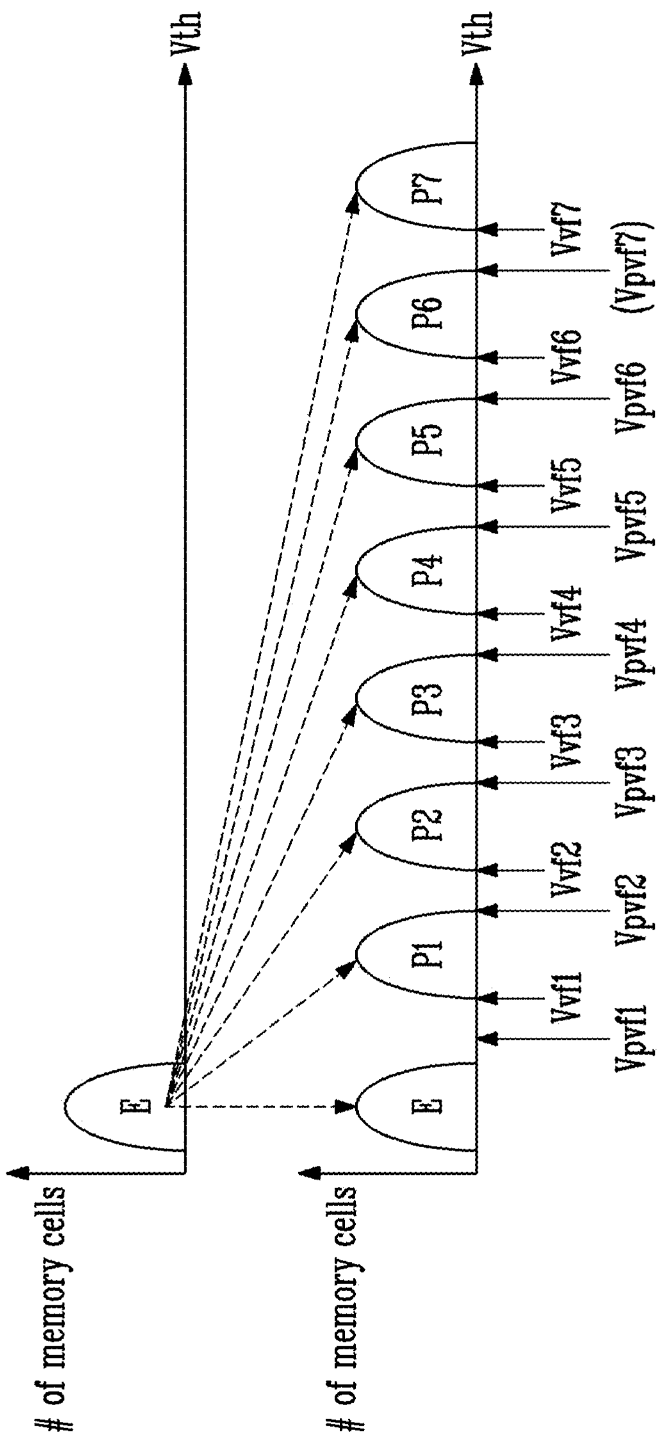
FIG. 3 is a diagram illustrating a program state of a memory cell according to an embodiment of the present disclosure.

FIG. 3 is a diagram illustrating a program state of a memory cell according to an embodiment of the present disclosure.

Referring to FIG. 3, the memory cell may be programmed to an erase state E or seven program states (P1 to P7) in response to a threshold voltage. The memory cell of FIG. 3 is shown as a triple level cell (TLC) to be capable of being programmed to one erase state and 7 program states, but this is merely an example for convenience of explanation. When implemented, the memory cell may be implemented as a multi-level cell (MLC), a single level cell (SLC), a quad level cell (QLC) or the like. The erase state and the program state are divided for convenience of explanation, but the erase state may be expressed as a 0-th program state P0. Therefore, the erase state E and the seven program states P1 to P7 shown in FIG. 3 may be expressed as the 0-th to seventh program states.

The memory cells connected to the selected word line may respectively have threshold voltages included in any one of the erase state E and the seven program states P1 to P7. Namely, each of the memory cells may be programmed to have the threshold voltage included in one of the erase state E and the seven program states P1 to P7. The memory cells may be in the erase state E before the program operation is performed. During the program operation, the memory cells in the erase state E may be programmed to any one of the seven program states as the program voltage is applied to the selected word line.

Furthermore, the erase states E or the seven program states P1 to P7 of the memory cells may be divided by the verify voltage. Here, the verify voltage may be divided into the main verify voltage and the pre-verify voltage. The pre-verify voltage may mean a voltage having a lower potential level than the main verify voltage, and be applied before applying the main verify voltage to the selected word line.

In addition, the consecutive program states of the memory cells may be divided by the main verify voltage and the pre-verify voltage. For example, the erase state E and the first program state P1 may be divided by a first pre-verify voltage Vpvf1 and a first main verify voltage Vvf1. The first program state P1 and the second program state P2 may be divided by a second pre-verify voltage Vpvf2 and a second main verify voltage Vvf2. The second program state P2 and the third program state P3 may be divided by a third pre-verify voltage Vpvf3 and a third main verify voltage Vvf3. The third program state P3 and the fourth program state P4 may be divided by a fourth pre-verify voltage Vpvf4 and a fourth main verify voltage Vvf4. The fourth program state P4 and the fifth program state P5 may be divided by a fifth pre-verify voltage Vpvf5 and a fifth main verify voltage Vvf5. The fifth program state P5 and the sixth program state P6 may be divided by a sixth pre-verify voltage Vpvf6 and a sixth main verify voltage Vvf6. The sixth program state P6 and the seventh program state P7 may be divided by a seventh pre-verify voltage Vpvf7 and a seventh main verify voltage Vvf7. According to an embodiment disclosed herein, the sixth program state P6 and the seventh program state P7 may be divided by the seventh main verify voltage Vvrf7. In order to reduce a program time, the seventh pre-verify voltage Vpvf 7 might not be applied.

The pre-verify voltage and the main verify voltage may be used to determine a potential level precharged to the bit line or a program voltage level applied to the selected word line. For example, the threshold voltage of the memory cell may be divided into three states determined by the first pre-verify voltage and the first main verify voltage. Namely, the threshold voltage of the memory cell in a first state may be lower than the first pre-verify voltage, in a second state may be higher than the first pre-verify voltage and lower than the first main verify voltage, and in a third state may be higher than the first main verify voltage.

A memory cell having a threshold voltage in the first state may be programmed with a higher program voltage level than that of a memory cell having a threshold voltage in the second state or the third state. Alternatively, a bit line connected to a memory cell having a threshold voltage in the first state may be precharged to a higher voltage level than that of a bit line connected to a memory cell having a threshold voltage in the second state or the third state.

A memory cell having a threshold voltage in the second state may be programmed with a lower program voltage level than that of a memory cell having a threshold voltage in the first state and a higher program voltage level than that of a memory cell having a threshold voltage in the third state. Alternatively, a bit line connected to a memory cell having a threshold voltage in the second state may be precharged to a lower voltage level than that of a bit line connected to a memory cell having a threshold voltage in the second state, and a higher voltage level than that of a bit line connected to a memory cell having a threshold voltage in the third state.

In the program method shown in FIG. 3, the seven program states (P1 to P7) may be formed in one erase state E. The program states shown in FIG. 3 may be formed while a program operation including first to M-th program loops shown in FIG. 4 to be described below is performed once.

Figure 4:
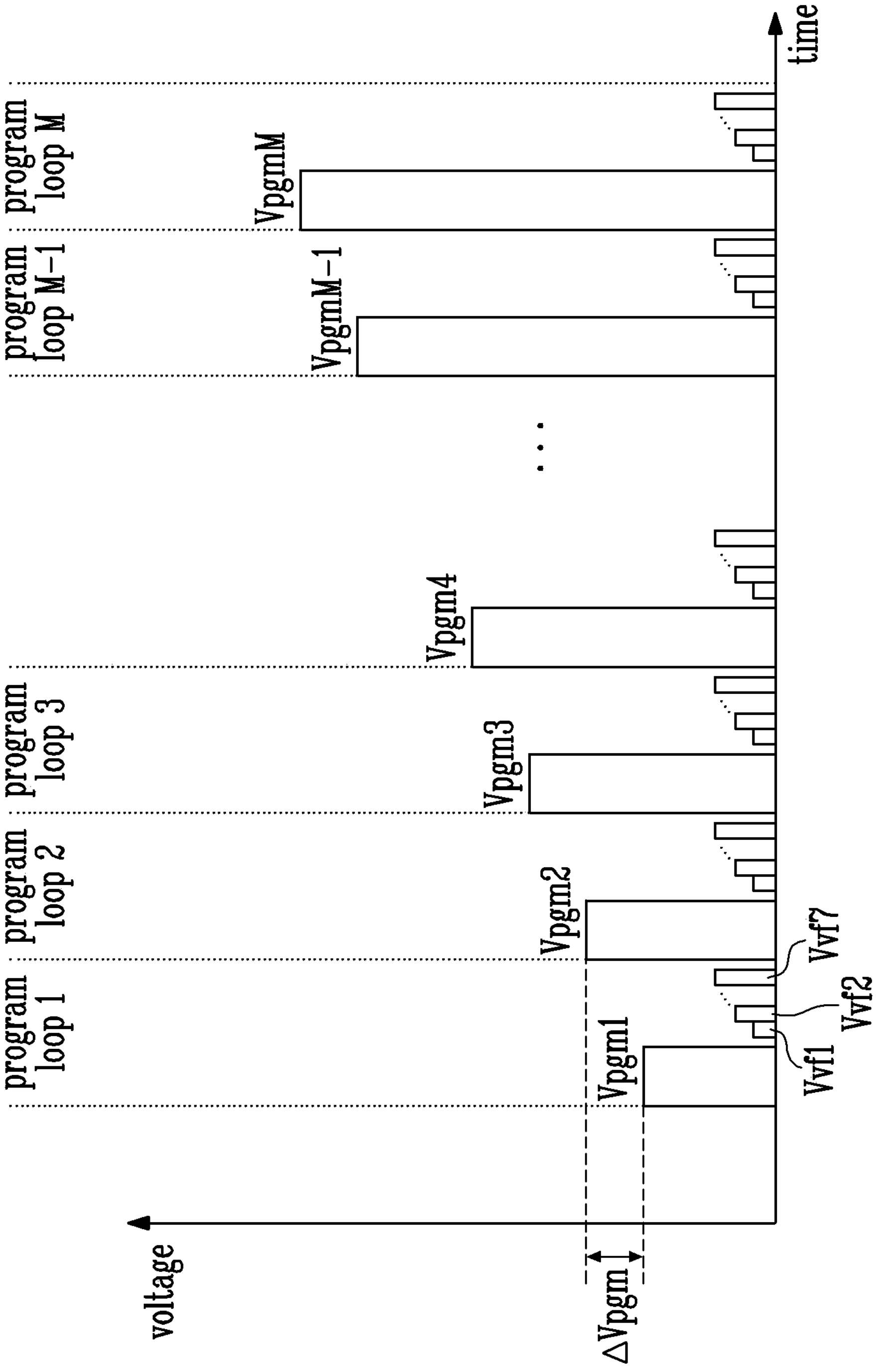
FIG. 4 is a diagram illustrating a voltage applied to a word line during a program operation according to an embodiment of the present disclosure.

FIG. 4 is a diagram illustrating a voltage applied to a word line during a program operation according to an embodiment of the present disclosure.

Referring to FIG. 4, a program operation of forming the program state of FIG. 3 may include the M program loops. Each of the program loops may include a program voltage application operation of applying a program voltage to a selected word line and a verify operation of applying a verify voltage to the selected word line. The program voltage apply operation may be an operation of increasing the threshold voltage of the memory cell, and the verify operation may be an operation of determining the threshold voltage to check whether the corresponding memory cell reaches a target program state. For example, the first program loop may include an operation of applying a first program voltage Vpgm1 and a plurality of main verify voltages Vvf1 to Vvf7 to the selected word line. For convenience of explanation, it is illustrated that the seven main verify voltages are applied to all the program loops, but the number of the verify voltages is not limited thereto, and different main verify voltages and pre-verify voltages may be applied.

As the program loops are sequentially performed, the program voltage may increase by a step voltage ΔVpgm. This is called as an incremental step pulse program (ISPP) manner. For example, a second program voltage Vpgm2 applied to the selected word line in the second program loop may be higher than the first program voltage Vpgm1 by the step voltage ΔVpgm. For convenience of explanation, the step voltage is shown as fixed, but the step voltage may be dynamically changed.

The memory cell reaching the target program state while performing the M program loops may become a program-inhibit state so that the program is not performed any more. Even though successive program loops are performed, the threshold voltage of the memory cell may be maintained in the program-inhibit state. For example, a memory cell programmed to the second program state P2 that is the target program state in the second program loop may become the program-inhibit state while performing the third program loop. In the embodiment, a bit line of the memory cell reaching the target program state may be precharged to the program-inhibit voltage. When the bit line is precharged to the program-inhibit voltage, a channel of the memory cell may be self-boosted by the program voltage and the memory cell might not be programmed.

Figure 5:
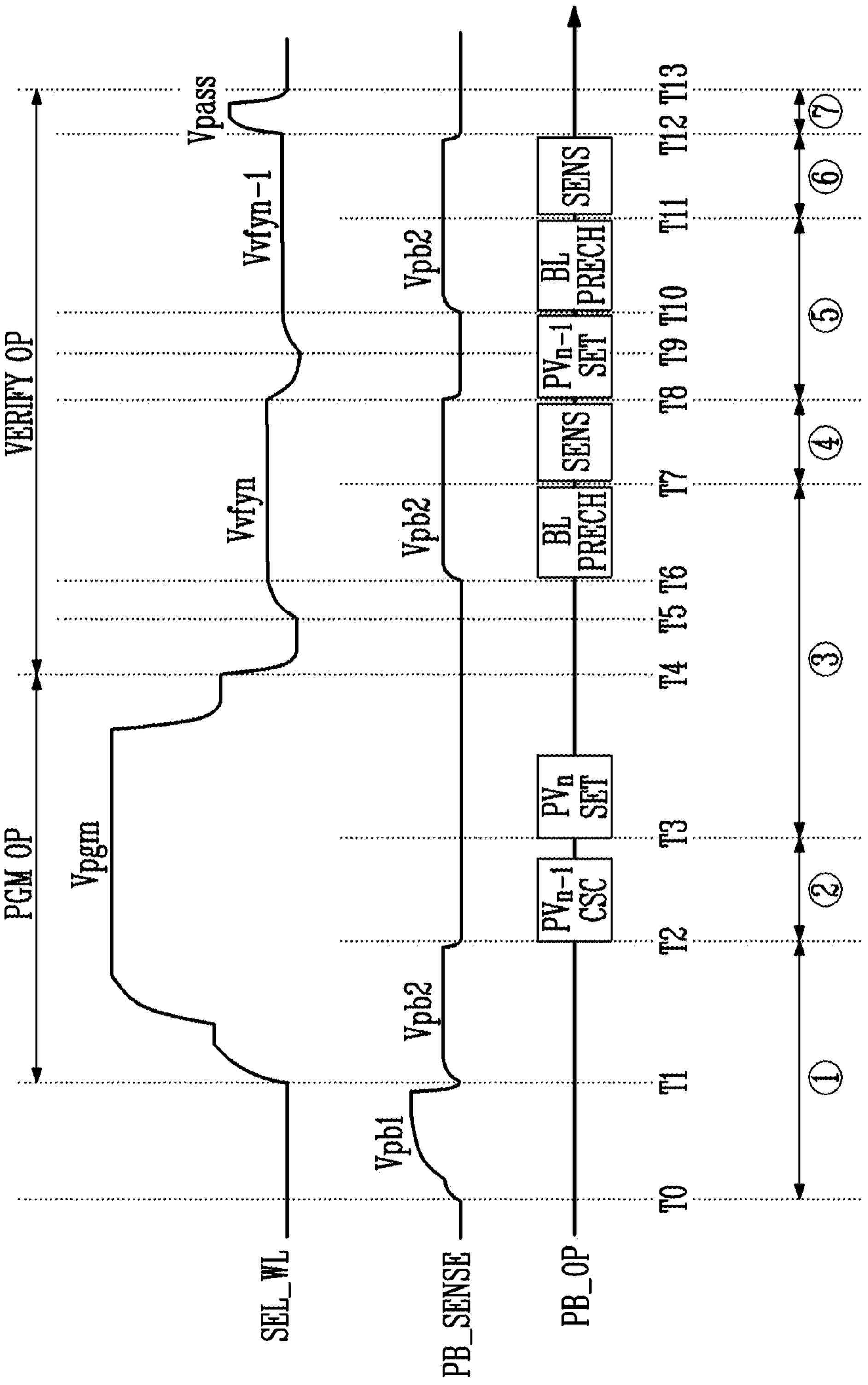
FIG. 5 is a diagram illustrating data stored in a page buffer during a program operation according to an embodiment of the present disclosure.

FIG. 5 is a diagram illustrating data stored in a page buffer during a program operation according to an embodiment of the present disclosure. The uppermost portion of FIG. 5 may represent a voltage applied to a selected word line SEL_WL, the middle portion may represent a voltage level of the bit line connection signal PB_SENSE, and the lowermost portion may represent an operation PB_OP of the page buffer PB. In addition, during the verify operation VERIFY OP in FIG. 5, at least two states $PV_{n-1}$, and $PV_n$ among the plurality of program states may be verified.

Referring to FIGS. 2 and 5, at T0, the bit line connection signal PB_SENSE may increase to a first voltage level Vpb1 in order to set the program data.

In a period from T1 to T4, the program voltage application operation PGM OP may be performed.

At T1, the program voltage Vpgm may be applied to the selected word line SEL_WL.

In addition, the bit line connection signal PB_SENSE may increase to a second voltage level Vpb2 in order to set the program data.

At T2, the page buffer PB may provide a sensing voltage VPB or a sensing current IPB to a sensing circuit for a check operation $PV_{n-1}$ CSC for determining pass or fail of the verify operation. Here, the check operation $PV_{n-1}$ CSC may determine whether the verify operation for an (n−1)-th program state $PV_{n-1}$ has passed.

At T3, after the check operation $PV_{n-1}$ CSC is completed, the plurality of page buffers may perform a precharge data setting operation $PV_n$ SET of storing the precharge data. For example, the precharge data setting operations $PV_n$ SET may be an operation of setting the precharge data for precharging the bit line BL during the verify operation for the n-th program state $PV_n$. For example, the precharge data may be used to precharge the bit line BL connected to the memory cell programmed to the n-th program state $PV_n$ to be verified first between the (n−1)-th program state $PV_{n-1}$ and the n-th program state $PV_n$.

In an embodiment, the page buffer PB may perform the precharge data setting operation $PV_n$ SET while the program voltage Vpgm is applied to the selected word line SEL_WL. Specifically, the first latch 210 in the page buffer PB may store the precharge data while the program voltage Vpgm is applied to the selected word line SEL_WL.

In a period from T4 to T13, the verify operation VERIFY OP may be performed.

At T4, the voltage of the selected word line SEL_WL may be decreased.

For example, the row decoder 121 may perform an under drive operation of decreasing the voltage of the selected word line SEL_WL after the program voltage Vpgm is applied to the selected word line SEL_WL.

At T5, the row decoder 121 may apply a verify voltage Vvfyn to the selected word line SEL_WL. Here, the verify voltage Vvfyn may be for verifying the n-th program state $PV_n$.

At T6, the plurality of page buffers may precharge (BL PRECH) the bit line based on the precharge data while the verify voltage Vvfyn is applied to the selected word line SEL_WL.

For example, the bit line connection signal PB_SENSE may increase to the second voltage level Vpb2 in order to precharge the bit line BL. Accordingly, the bit line BL is connected to the precharge circuit 260 in the page buffer PB, and the bit line BL may be precharged by the precharge circuit 260. Here, the voltage to be precharged on the bit line BL may be determined based on the precharge data stored in the first latch 210.

At T7, the page buffer PB may sense the data from the memory cell through the bit line BL. For example, the page buffer PB may sense the current or voltage of the bit line BL connected to the memory cell.

At T8, the voltage of the selected word line SEL_WL may be decreased.

For example, the row decoder 121 may perform the under drive operation of decreasing the voltage of the selected word line SEL_WL.

In addition, the bit line connection signal PB_SENSE may be changed to a low level.

In addition, the page buffer PB may perform the precharge data setting operation $PV_{n-1}$ SET of storing the precharge data. For example, the precharge data setting operation $PV_{n-1}$ SET may be an operation of setting the precharge data for precharging the bit line BL during the verify operation for the (n−1)-th program state $PV_{n-1}$. For example, the precharge data may be used to precharge the bit line BL connected to the memory cell programmed to the (n−1)-th program state $PV_{n-1}$.

At T9, the row decoder 121 may apply the verify voltage Vvfyn−1 to the selected word line SEL_WL. Here, the verify voltage Vvfyn−1 may be a voltage for verifying the (n−1)-th program state $PV_{n-1}$.

At T10, the plurality of page buffers may precharge (BL PRECH) the target bit line based on the precharge data while the verify voltage Vvfyn−1 is applied to the selected word line SEL_WL.

For example, the bit line connection signal PB_SENSE may increase to the second voltage level Vpb2 in order to precharge the bit line BL. Accordingly, the bit line BL is connected to the precharge circuit 260 in the page buffer PB, and the bit line BL may be precharged by the precharge circuit 260. Here, the voltage precharged on the bit line BL may be determined based on the precharge data stored in the first latch 210.

At T11, the page buffer PB may sense the data from the memory cell through the bit line BL. For example, the page buffer PB may sense the current or voltage of the bit line BL connected to the memory cell.

At T12, the voltage of the selected word line SEL_WL may be discharged.

For example, the selected word line SEL_WL may be changed to a pass voltage Vpass through a word line equalize operation and then is discharged to the ground voltage.

In addition, the bit line connection signal PB_SENSE may be changed to the low level.

Meanwhile, data to be stored in the page buffer PB may be differed for each period in response to the operation PB_OP of the page buffer PB. For example, a period from T0 to T2 may be referred to as ① period, a period from T2 to T3 may be referred to as ② period, a period from T3 to T7 may be referred to as ③ period, a period T7 to T8 may be referred to as ④ period, a period from T8 to T11 may be referred to as ⑤ period, a period from T11 to T12 may be referred to as ⑥ period, and a period from T12 to T13 may be referred to as ⑦ period. In each period, data stored in the page buffer PB will be described below in detail with reference to FIG. 6.

FIG. 6 is a diagram illustrating data stored in the plurality of latches during the program operation according to an embodiment of the present disclosure.

Referring to FIGS. 2 and 6, in ① period, the first latch 210 may store the main verify data. In ② period, the first latch 210 may store data ($PV_{n-1}$ CSC data) used for the check operation for the (n−1)-th program state $PV_{n-1}$. In ③ period, the first latch 210 may store the precharge data ($PV_n$ precharge data) used for the bit line precharge operation during the verify operation for the n-th program state $PV_n$. In ④ period, the first latch 210 may store the data ($PV_n$ sensing data) sensed from the memory cell for the verify operation in the n-th program state $PV_n$. In ⑤ period, the first latch 210 may store the data ($PV_n$ sensing data) sensed from the memory cell for the verify operation in the n-th program state $PV_n$ and the precharge data ($PV_{n-1}$ precharge data) used for the bit line precharge operation during the verify operation for the (n−1)-th program state $PV_{n-1}$. In ⑥ and ⑦ periods, the first latch 210 may store the data ($PV_{n-1}$ sensing data) sensed from the memory cell for the verify operation in the (n−1)-th program state PVn-1.

The second latch 220 may store the pre-verify data in ① to ⑦ periods.

The third latch 230 may store the LSB data and the main verify data in ① to ⑥ periods. In addition, the third latch 230 may store the LSB data and the main verify data updated by the result of the verify operation in ⑦ period.

The fourth latch 240 may store the CSB data and the main verify data in ① to ⑥ periods. In addition, the fourth latch 240 may store the CSB data and the main verify data updated by the result of the verify operation in ⑦ period.

The fifth latch 250 may store the MSB data and the main verify data in ① to ⑥ periods. In addition, the fifth latch 250 may store the MSB data and the main verify data updated by the result of the verify operation in ⑦ period.

Meanwhile, the page buffer PB connected to the verify-passed memory cell may set values stored in the third to fifth latches 230 to 250 to be the same as the values corresponding to the erase state E.

FIG. 7 is a diagram illustrating data stored in the first latch during the program operation according to an embodiment of the present disclosure. Specifically, FIG. 7 illustrates the data stored in the first latch connected to the corresponding memory cell for each state of the memory cell. For convenience of explanation, illustrated in FIG. 7 may be the data stored in the first latch 210 connected to a memory cell that is a target of the verify operation in the current program loop and corresponds to the (n−1)-th program state $PV_{n-1}$ and the n-th program state $PV_n$.

Referring to FIG. 7, in the ① period, when the memory cell corresponds to the erase state E, the first latch 210 may store a logic value '1'. When the memory cell corresponds to the (n−1)-th program state $PV_{n-1}$, but does not pass the verification, the first latch 210 may store a logic value '0'. When the memory cell corresponds to the (n−1)-th program state $PV_{n-1}$ and passes the verification, the first latch 210 may store a logic value '1'. When the memory cell corresponds to the n-th program state $PV_n$, but does not pass the verification, the first latch 210 may store a logic value '0'. When the memory cell corresponds to the n-th program state $PV_n$ and passes the verification, the first latch 210 may store a logic value '1'.

The ② period may be a period in which a check operation for the (n−1)-th program state $PV_{n-1}$ is performed. Accordingly, in the ② period, when the memory cell corresponds to the erase state E, the first latch 210 may store a logic value '0'. When the memory cell corresponds to the (n−1)-th program state $PV_{n-1}$, but does not pass the verification, the first latch 210 may store a logic value '1'. When the memory cell corresponds to the (n−1)-th program state $PV_{n-1}$ and passes the verification, the first latch 210 may store a logic value '0'. When the memory cell corresponds to the n-th program state $PV_n$, the first latch 210 may store a logic value '0'.

The ③ period may be a period in which the bit line precharge operation is performed during the verify operation for the n-th program state $PV_n$. Accordingly, in the ③ period, when the memory cell corresponds to the erase state E, the first latch 210 may store a logic value '0'. When the memory cell corresponds to the (n−1)-th program state $PV_{n-1}$, the first latch 210 may store a logic value '0'. When the memory cell corresponds to the n-th program state $PV_n$, but does not pass the verification, the first latch 210 may store a logic value '1'. When the memory cell corresponds to the n-th program state $PV_n$ and passes the verification, the first latch 210 may store a logic value '0'.

The ④ period may be a period in which the sensing operation is performed during the verify operation for the n-th program state $PV_n$. Accordingly, in the ④ period, when the memory cell corresponds to the erase state E, the first latch 210 may store a logic value '0'. When the memory cell corresponds to the (n−1)-th program state $PV_{n-1}$, the first latch 210 may store a logic value '0'. When the memory cell corresponds to the n-th program state $PV_n$, but does not pass the verification, the first latch 210 may store a logic value '0'. When the memory cell corresponds to the n-th program state $PV_n$ and passes the verification, the first latch 210 may store a logic value '1'.

The ⑤ period may be a period in which the bit line precharge operation is performed during the verify operation for the n-th program state $PV_n$. Accordingly, in the ⑤ period, when the memory cell corresponds to the erase state E, the first latch 210 may store a logic value '0'. When the memory cell corresponds to the (n−1)-th program state $PV_{n-1}$, but does not pass the verification, the first latch 210 may store a logic value '1'. When the memory cell corresponds to the (n−1)-th program state $PV_{n-1}$ and passes the verification, the first latch 210 may store a logic value '0'. When the memory cell corresponds to the n-th program state $PV_n$, but does not pass the verification, the first latch 210 may store a logic value '0'. When the memory cell corresponds to the n-th program state $PV_n$ and passes the verification, the first latch 210 may store a logic value '1'. Namely, the first latch 210 may set the precharge data for the bit line precharge operation in the (n−1)-th program state $PV_{n-1}$ while maintaining the result of the sensing operation for the n-th program state $PV_n$.

The ⑥ period may be a period in which the sensing operation is performed during the verify operation for the n-th program state $PV_n$. Accordingly, in the ⑥ period, when the memory cell corresponds to the erase state E, the first latch 210 may store a logic value '0'. When the memory cell corresponds to the (n−1)-th program state $PV_{n-1}$, but does not pass the verification, the first latch 210 may store a logic value '0'. When the memory cell corresponds to the (n−1)-th program state $PV_{n-1}$ and passes the verification, the first latch 210 may store a logic value '1'. When the memory cell corresponds to the n-th program state $PV_n$, but does not pass the verification, the first latch 210 may store a logic value '0'. When the memory cell corresponds to the n-th program state $PV_n$ and passes the verification, the first latch 210 may store a logic value '1'. Namely, the first latch 210 may store the result of the sensing operation for the (n−1)-th program state $PV_{n-1}$ while maintaining the result of the sensing operation for the n-th program state $PV_n$.

In the ⑦ period, the first latch 210 may maintain the data in the ⑥ period. Here, the first latch 210 may update the main verify data in the third to fifth latches 230 to 250 before performing the next program loop.

Figure 8:
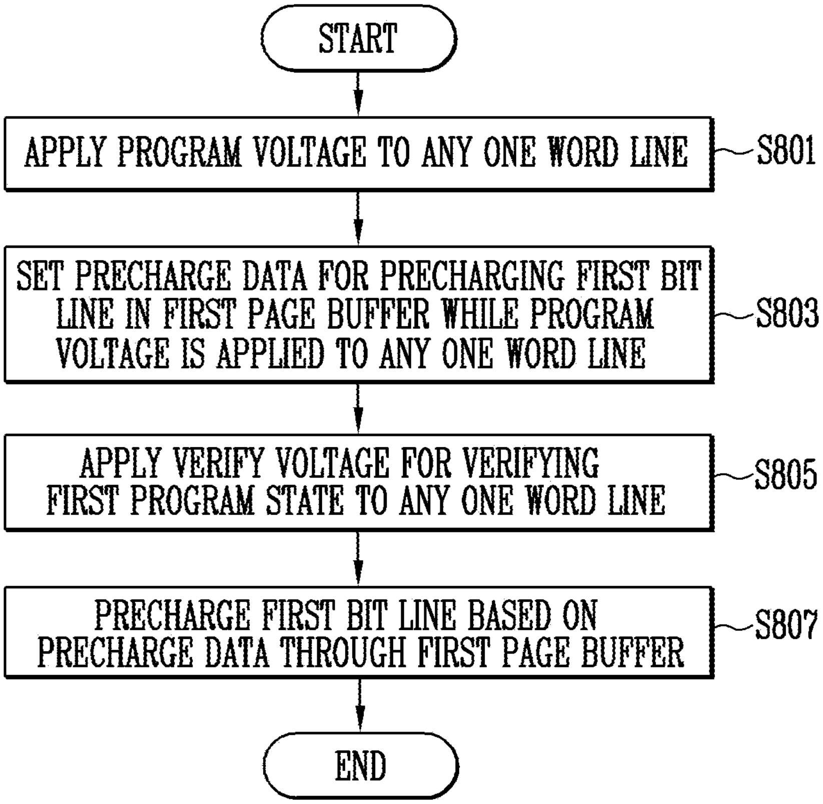
FIG. 8 is a flowchart illustrating a method of operating a memory device according to an embodiment of the present disclosure.

FIG. 8 is a flowchart illustrating a method of operating a memory device according to an embodiment of the present disclosure. The method shown in FIG. 8 may be performed by, for example, the memory device 100 shown in FIG. 1.

Referring to FIG. 8, at operation S801, the memory device 100 may apply a program voltage to any one word line. In an embodiment, the any one of the plurality of word lines may be referred to as a selected word line.

At operation S803, while the program voltage is applied to the one word line, the memory device 100 may set precharge data for precharging a first bit line connected to a memory cell corresponding to a first program state in a first page buffer connected to the first bit line.

For example, the memory device 100 may set the precharge data in any one of a plurality of latches included in the first page buffer.

At operation S805, the memory device 100 may apply a verify voltage for verifying the first program state to the one word line.

At operation S807, the memory device 100 may precharge the first bit line based on the precharge data through the first page buffer.

For example, while the verify voltage is applied to the one word line, the memory device 100 may precharge the first bit line based on the precharge data.

Figure 9:
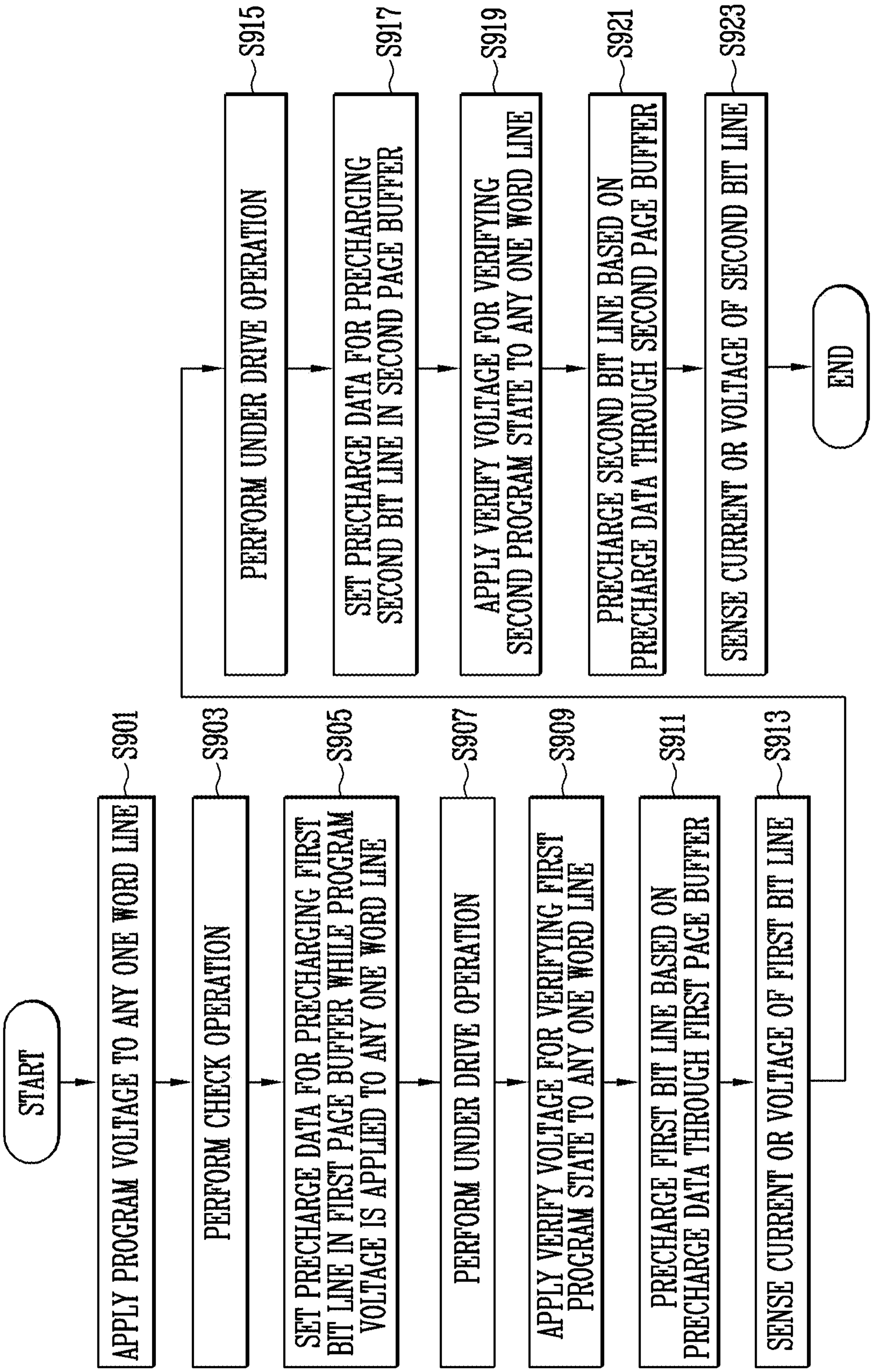
FIG. 9 is a flowchart illustrating an additional embodiment of a method of operating a memory device according to an embodiment of the present disclosure.

FIG. 9 is a flowchart illustrating an additional embodiment of a method of operating a memory device according to an embodiment of the present disclosure. The method shown in FIG. 9 may be performed by, for example, the memory device 100 shown in FIG. 1.

Referring to FIG. 9, at operation S901, the memory device 100 may apply a program voltage to any one word line.

At operation S903, the memory device 100 may perform a check operation of determining pass or fail of a verify operation based on data sensed from a plurality of memory cells while a program voltage is applied to any one word line.

At operation S905, while the program voltage is applied to the one word line, the memory device 100 may set precharge data for precharging a first bit line connected to a memory cell corresponding to a first program state in a first page buffer connected to the first bit line.

At operation S907, the memory device 100 may perform an under drive operation of decreasing a voltage of the one word line.

At operation S909, the memory device 100 may apply a verify voltage for verifying the first program state to the one word line.

At operation S911, the memory device 100 may precharge the first bit line based on the precharge data through the first page buffer.

At operation S913, the memory device 100 may sense a current or voltage of the first bit line.

At operation S915, the memory device 100 may perform the under drive operation.

At operation S917, the memory device 100 may set precharge data for precharging a second bit line connected to a memory cell corresponding to a second program state in a second page buffer connected to the second bit line.

At operation S919, the memory device 100 may apply a verify voltage for verifying the second program state to the one word line.

At operation S921, the memory device 100 may precharge the second bit line based on the precharge data for precharging the second bit line through the second page buffer.

At operation S923, the memory device 100 may sense a current or voltage of the second bit line.

According to an embodiment of the present disclosure, there are provided a memory device capable of improving the performance of a program operation by reducing the time required for a bit line precharge operation, and a method of operating the memory device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device, comprising:

a plurality of memory cells each connected to at least one of a plurality of word lines, the at least one of the plurality of word lines being a selected word line, and programmed to any one of a plurality of program states;

a row decoder configured to apply a program voltage or a verify voltage to the selected word line;

a plurality of page buffers connected to the plurality of memory cells through a plurality of bit lines and configured to store precharge data used to determine a precharge voltage of a target bit line connected to a verify target memory cell among the plurality of bit lines while the program voltage is applied to the selected word line; and control logic configured to, after sensing a current or voltage of a first bit line among the plurality of bit lines, control a page buffer connected to a second bit line among the plurality of bit lines to set precharge data used to determine a precharge voltage of the second bit line.

2. The memory device according to claim 1, further comprising:

a sensing circuit configured to perform a check operation of determining pass or fail of a verify operation based on data sensed from the plurality of memory cells while the program voltage is applied to the selected word line.

3. The memory device according to claim 2, wherein the plurality of page buffers store the precharge data after the check operation is completed.

4. The memory device according to claim 1, where the row decoder is configured to, after applying the program voltage to the selected word line, perform an under drive operation of decreasing a voltage of the selected word line, and apply the verify voltage to the selected word line.

5. The memory device according to claim 4, wherein the plurality of page buffers precharge the target bit line based on the precharge data while the verify voltage is applied to the selected word line.

6. The memory device according to claim 1, wherein when a verify operation for at least two of the plurality of program states is performed, the precharge data is used to precharge a bit line connected to a memory cell programmed to a program state to be verified first among the at least two program states.

7. The memory device according to claim 1, wherein each of the plurality of page buffers comprises a plurality of latches and stores the precharge data in any one of the plurality of latches.

8. A method of operating a memory device, the memory device including a plurality of memory cells connected to at least one of a plurality of word lines, the at least one of the plurality of word lines being a selected word line, and a plurality of page buffers connected to the plurality of memory cells through a plurality of bit lines, the method comprising:

applying a program voltage to the selected word line;

setting precharge data for precharging a first bit line connected to a memory cell corresponding to a first program state among the plurality of bit lines in a first page buffer connected to the first bit line among the plurality of page buffers while the program voltage is applied to the selected word line;

applying a verify voltage for verifying the first program state to the selected word line;

precharging the first bit line through the first page buffer based on the precharge data; and after sensing a current or voltage of the first bit line, setting, in a page buffer connected to a second bit line among the plurality of bit lines, precharge data for the second bit line.

9. The method according to claim 8, further comprising:

performing a check operation of determining a pass or fail of a verify operation based on data sensed from the plurality of memory cells while the program voltage is applied to the selected word line, wherein setting the precharge data in the first page buffer is performed after performing the check operation.

10. The method according to claim 8, wherein setting the precharge data in the first page buffer comprises:

setting the precharge data in at least any one of a plurality of latches included in the first page buffer.

11. The method according to claim 8, further comprising:

performing an under drive operation of decreasing a voltage of the selected word line after the applying the program voltage to the selected word line, wherein applying the verify voltage to the selected word line is performed after performing the under drive operation.

12. The method according claim 8, wherein precharging the first bit line comprises:

precharging the first bit line based on the precharge data while the verify voltage is applied to the selected word line.

13. The method according to claim 8, further comprising:

sensing a current or voltage of the first bit line after precharging the first bit line.

14. The method according to claim 13, comprising:

after sensing, setting precharge data for precharging a second bit line connected to a memory cell corresponding to a second program state among the plurality of bit lines in a second page buffer connected to the second bit line among the plurality of page buffers;

applying a verify voltage for verifying the second program state to the selected word line; and precharging the second bit line based on the precharge data for precharging the second bit line through the second page buffer; and sensing a current or voltage of the second bit line.

15. A memory device, comprising:

a plurality of memory cells each connected to at least one of a plurality of word lines, the at least one of the plurality of word lines being a selected word line, and programmed to any one of a plurality of program states;

a plurality of page buffers connected to the plurality of memory cells through a plurality of bit lines and configured to store data sensed from the plurality of memory cells; and control logic configured to control a first page buffer connected to a first bit line among a plurality of bit lines among the plurality of page buffers to set first precharge data used to determine a precharge voltage of the first bit line while a program voltage is applied to the selected word line, and after sensing a current or voltage of the first bit line, control a page buffer connected to a second bit line among the plurality of bit lines to set second precharge data used to determine a precharge voltage of the second bit line.

16. The memory device according to claim 15, wherein the control logic is configured to precharge the first bit line based on the first precharge data through the first page buffer and to control the first page buffer to sense a current or voltage of the precharged first bit line while a verify voltage is applied to the selected word line.

17. The memory device according to claim 16, wherein the control logic is configured to, after sensing the current or voltage of the precharged first bit line, control a second page buffer connected to a second bit line among the plurality of bit lines, among the plurality of page buffers, to set second precharge data used to determine a precharge voltage of the second bit line.

18. The memory device according claim 17, wherein the memory cell connected to the first bit line is programmed to have a higher threshold voltage than a memory cell connected to the second bit line.

* * * * *